US00RE39768E

(19) United States
(12) Reissued Patent
Rhodes

(10) Patent Number: US RE39,768 E
(45) Date of Reissued Patent: Aug. 14, 2007

(54) VCC PUMP FOR CMOS IMAGERS

(75) Inventor: Howard E. Rhodes, Boise, ID (US)

(73) Assignee: Micron Technology, Inc., Boise, ID (US)

(21) Appl. No.: 10/283,165

(22) Filed: Oct. 30, 2002

Related U.S. Patent Documents

Reissue of:
(64) Patent No.: 6,140,630
Issued: Oct. 31, 2000
Appl. No.: 09/172,301
Filed: Oct. 14, 1998

(51) Int. Cl.
*H01J 40/14* (2006.01)

(52) U.S. Cl. ..... 250/208.1; 257/239; 348/294
(58) Field of Classification Search ..... 250/208.1, 250/214.1, 214 LA, 214 C; 257/225, 231, 257/236, 239; 358/443, 445, 447, 448; 377/58, 377/117; 348/294, 297
See application file for complete search history.

(56) References Cited

U.S. PATENT DOCUMENTS 4,374,700 A * 2/1983 Scott et al. ..... 438/586
4,820,936 A * 4/1989 Veendrick et al. ..... 327/534
5,038,325 A * 8/1991 Douglas et al. ..... 365/189.06
5,126,692 A * 6/1992 Shearer et al. ..... 331/8
5,287,393 A * 2/1994 Miwada ..... 377/60
5,319,604 A * 6/1994 Imondi et al. ..... 365/185.18
5,323,052 A * 6/1994 Koyama ..... 257/432
5,324,958 A * 6/1994 Mead et al. ..... 257/291
5,461,425 A * 10/1995 Fowler et al. ..... 348/294
5,471,515 A * 11/1995 Fossum et al. ..... 377/60
5,541,402 A * 7/1996 Ackland et al. ..... 250/208.1
5,576,763 A * 11/1996 Ackland et al. ..... 348/308
5,612,799 A * 3/1997 Yamazaki et al. ..... 349/42
5,614,744 A * 3/1997 Merrill ..... 257/291
5,625,210 A * 4/1997 Lee et al. ..... 257/292
5,689,208 A * 11/1997 Nadd ..... 327/390
5,705,846 A * 1/1998 Merrill ..... 257/462
5,708,263 A * 1/1998 Wong ..... 250/208.1
5,757,045 A * 5/1998 Tsai et al. ..... 257/336
2003/0029989 A1 * 2/2003 Stettner et al. ..... 250/208.1

OTHER PUBLICATIONS

Dickinson, A. et al., A256×256 CMOS Active Pixel Image Sensor with Motion Detection, 1995 IEEE International Solid–State Circuits Conference, pp. 226–227.*
Dickinson, A. et al., Standard CMOS Active Pixel Image Sensors for Multimedia Applications, Proceedings of Sixteenth Conference on Advanced Research in VLSI, Mar. 27–29, 1995, pp. 214–224.*
Eid, E_S., et al., A256×256 CMOS Active Pixel Image Sensor, Proc. SPIE vol. 2415, Apr. 1995, pp. 265–275.*
Fossum, E. CMOS Image Sensors: Electronic Camera On a Chip, 1995 IEEE, pp. 17–25.*
Fossum, E. et al., IEDM A 37×28mm 600k–Pixel CMOS APS Dental X–Ray Camera–on–a–Chip with Self–Triggered Readout, 1998 IEEE International Solid–State Crcuits Conference, pp. 172–173.*
Fossum, E., Low Power Camera–on–a–Chip Using CMOS Active Pixel sensor Technology, 1995 IEEE, pp. 74–77.*
Fossum, E., Architectures for focal plane image processing, Optical Engineering, vol. 28, No. 8, Aug. 1989, ppd. 865–871.*

(Continued)

*Primary Examiner*—Stephone B. Allen
(74) *Attorney, Agent, or Firm*—Dickstein Shapiro LLP

(57) ABSTRACT

A CMOS imaging device which includes a charge pump connected to one or more of a reset gate, transfer gate and row select gate of sensor cells and provides gate control signals which give the imaging device an increased dynamic range charge capacity while minimizing signal leakage. A charge pump may also supply control signals to photogates used in the cells.

161 Claims, 5 Drawing Sheets

OTHER PUBLICATIONS

Janesick, J., et al., New advancements in charge–coupled device technology–sub–electron noise and 4096×4096 pixel CCDs, Proc. SPIE vol. 1242, 1990, pp. 223–237.*

Kemeny, S. E., et al., Update on folca–plane image processing research, Proc. SPIE vol. 1447, 1991, pp. 243–250.*

Mendis, S., et al., CMOS Active Pixel Image Sensor, IEEE Transactions on Electron Devices, vol. 41, No. 3, Mar. 1994, pp. 452–453.*

Mendis, S. K., et al., A128×128 CMOS Active Pixel Image Sensors for Highly Integrated Imaging Systems, 1993 IEEE, pp. 583–586.*

Mendis, S. K. et al., CMOS Active Pixel Image Sensors for High Integrated Imaging Systems, IEEE Journal of Solid–State Circuits, vol. 32, No. 2, Feb. 1997, pp. 187–197.*

Mendis, S. K., et al., Low–Light–Level Image Sensor with On–Chip Signal Processing, Proc. SPIE vol. 1952, Nov. 1993, pp. 23–33.*

Mendis, S. K., et al., Progressin In CMOS Active Pixel Image Sensors, Proc. Spie vol. 2172, May 1994, pp. 19–29.*

Nakamura, J., et al., CMOS Active Pixel Image Sensor with Simple Floating Gate Pixels, IEE Transctions on Electron Devices, vol. 42, No. 9, Sep. 1995, pp. 1693–1694.*

Nixon, R. H., et al., 256×256 CMOS Active Pixel Sensor Cameral–on–a–Chip, IEEE Journal of Solid–State Circuits, vol. 31, No. 12, Dec. 1996, pp. 2046–2050.*

Nixon, R. H., et al., 256×256 CMOS Active Pixel Sensor Camera–on–a–Chip, 1996 IEEE Internation Solid–Stated Circuits Conference, pp. 178–179.*

Panicaci, R., et al., Programmable multiresolution CMOS Active–Pixel Image Sensor, Proc SPIE vol. 2654, Mar. 1996, pp. 72–79.*

Panicacci, R., et al., 128 Mb/s Multiport CMOS Binary Acitve–Pixel Image Sensor, 1996 IEEE International Solid–State Circuit Conference, pp. 100–101.*

Yadid–Pecht, O., et al., Wide dynamic range APS star tracker, Proc. SPIE vol. 2654, Mar. 1996, pp. 82–92.*

Yadid–Pecht, O., et al., CMOS Active Pixel Sensor Star Tracker with Regional Electronic Shutter, IEEE Journal of Solid–State Circuits, vol. 32, No. 2, Feb. 1997, pp. 285–288.*

Zarnowski, J., et al., Imaging options expand with CMOS technology, Laser Focus World, Jun. 1997, pp. 125–130.*

Zhou, Z., et al., A CMOS Imager with On–Chip Variable Resolution for Light–Adaptive Imaging, 1998 IEEE International Solid–State Circuits Conference, pp. 174–175.*

Ahou, Z., et al., A Digital CMOS Active Pixel Image Sensor For Multimedia Applications, Proc. SPIE vol. 2894, Sep. 1996, pp. 282–288.*

* cited by examiner

VCC PUMP FOR CMOS IMAGERS

Matter enclosed in heavy brackets [ ] appears in the original patent but forms no part of this reissue specification; matter printed in italics indicates the additions made by reissue.

FIELD OF THE INVENTION

The invention relates generally to improved semiconductor imaging devices and in particular to an imaging device which can be fabricated using a standard CMOS process. Particularly, the invention relates to a CMOS imager having an array of image sensing cells and to the driving signals which operate the cells.

DISCUSSION OF RELATED ART

There are a number of different types of semiconductor-based imagers, including charge coupled devices (CCDs), photodiode arrays, charge injection devices and hybrid focal plan arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there has been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time, CCDs may also suffer from incomplete charge transfer from pixel to pixel during charge transfer which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photo diodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p− substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD, e.g., 5 volts. The transfer and reset transistor 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS, e.g. 0 volts. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS−VOUTR) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. FIG. 4 shows a 2×2 portion of pixel array 200. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and the reset signal RST is nominally set at 2.5V.

As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD−Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81.

It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(3), 1997; and Eric R, Fossum, "CMOS Image Sensors: Electronic Camera on a Chip," IEDM Vol. 95 pages 17–25 (1995) as well as other publications. These references are incorporated herein by reference.

Prior CMOS imagers suffer from inconsistent noise effects, voltage drops and leakage across the reset transistor 31, the row select transistor 38 and the transfer transistor 29. These affect the dynamic range of the pixel output as well as the ability of the pixel to accurately depict an image. Moreover, due to imprecision in the fabrication process, the electrical properties of these transistors will vary from pixel to pixel causing inconsistent output for the same level of charge from pixel to pixel. Since the size of the pixel electrical signal is very small due to the collection of photons in the photo array, the signal to noise ratio of the pixel should be as high as possible and charge leakage within a pixel as low as possible. Moreover, pixel output and the leakage of charge must be as consistent as possible from pixel to pixel.

SUMMARY OF THE INVENTION

The present invention is designed to improve variations in the reset voltage and the leakage characteristics of a CMOS imager pixel while improving the consistency of the pixel to pixel output of the pixel array and increasing the dynamic range of the pixel output. This is accomplished by driving one or more of the reset gate, transfer gate (if used) and the row select gate with one or more charge pumps. The charge pump provides a higher voltage than the supply voltage VDD to improve the gating operation of the reset, transfer and row select transistors. The charge pump increases the voltage to the reset gate so that the voltage drop across the reset transistor does not lower the VDD reset charge at floating diffusion node 30 and increases the voltage to the transfer gate to allow barrier and well lowering in its operation. By overdriving one or more of the gates of the reset, transfer and row select transistors with the output of a charge pump, pixel to pixel fabrication differences in electrical characteristics of these transistors can also be avoided. Moreover, if a photogate is used to acquire image charges this too may be overdriven by an output voltage from a charge pump. Since the photogate turn on voltage is typically VSS, e.g., 0 volts, a charge pump is used which drives the photogate with an even lower voltage than VSS. Additionally, the photogate may be overdriven, e.g. 6 volts, during charge collection to assure that charge is effectively collected by the device.

The above and other advantages and features of the invention will be more clearly understood from the following detailed description which is provided in connection with the accompanying drawings.

DETAILED DESCRIPTION OF THE PREFERRED EMBODIMENTS

Figure 1:
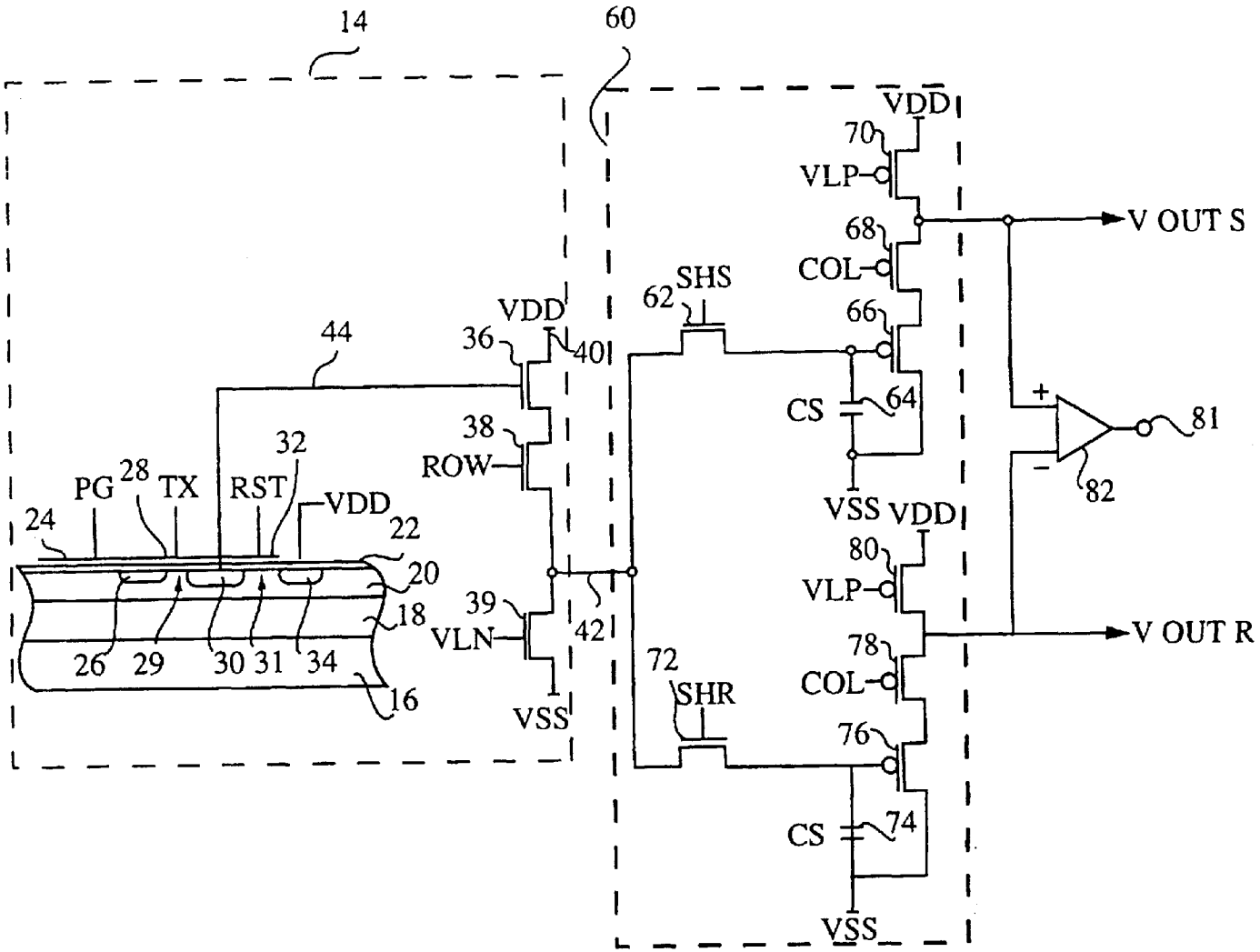
FIG. 1 is a representative circuit of the CMOS imager.
Figure 2:
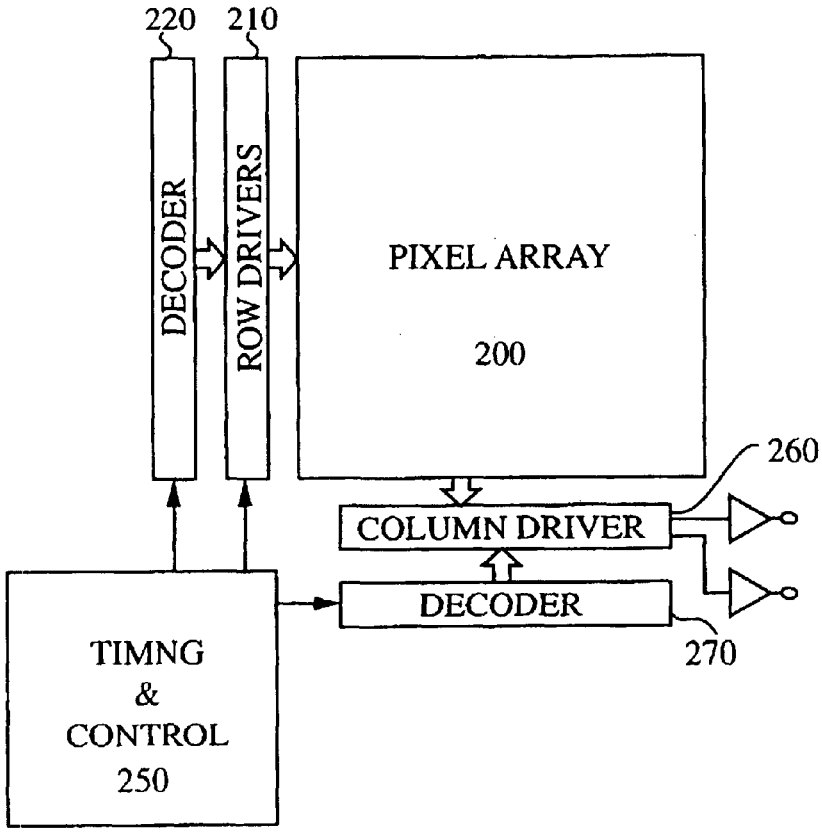
FIG. 2 is a block diagram of a CMOS active pixel sensor chip.
Figure 3:
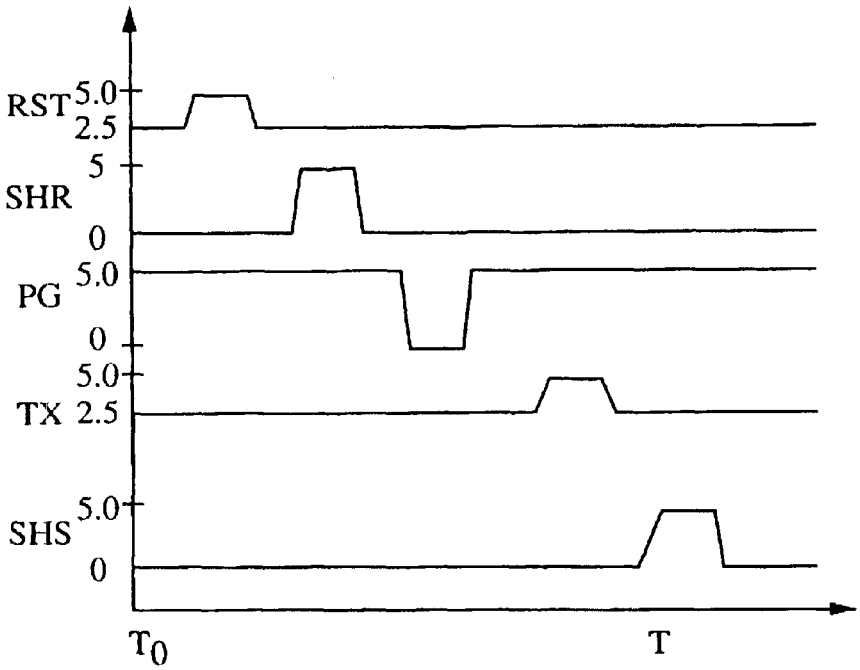
FIG. 3 is a representative timing diagram for the CMOS imager.
Figure 4:
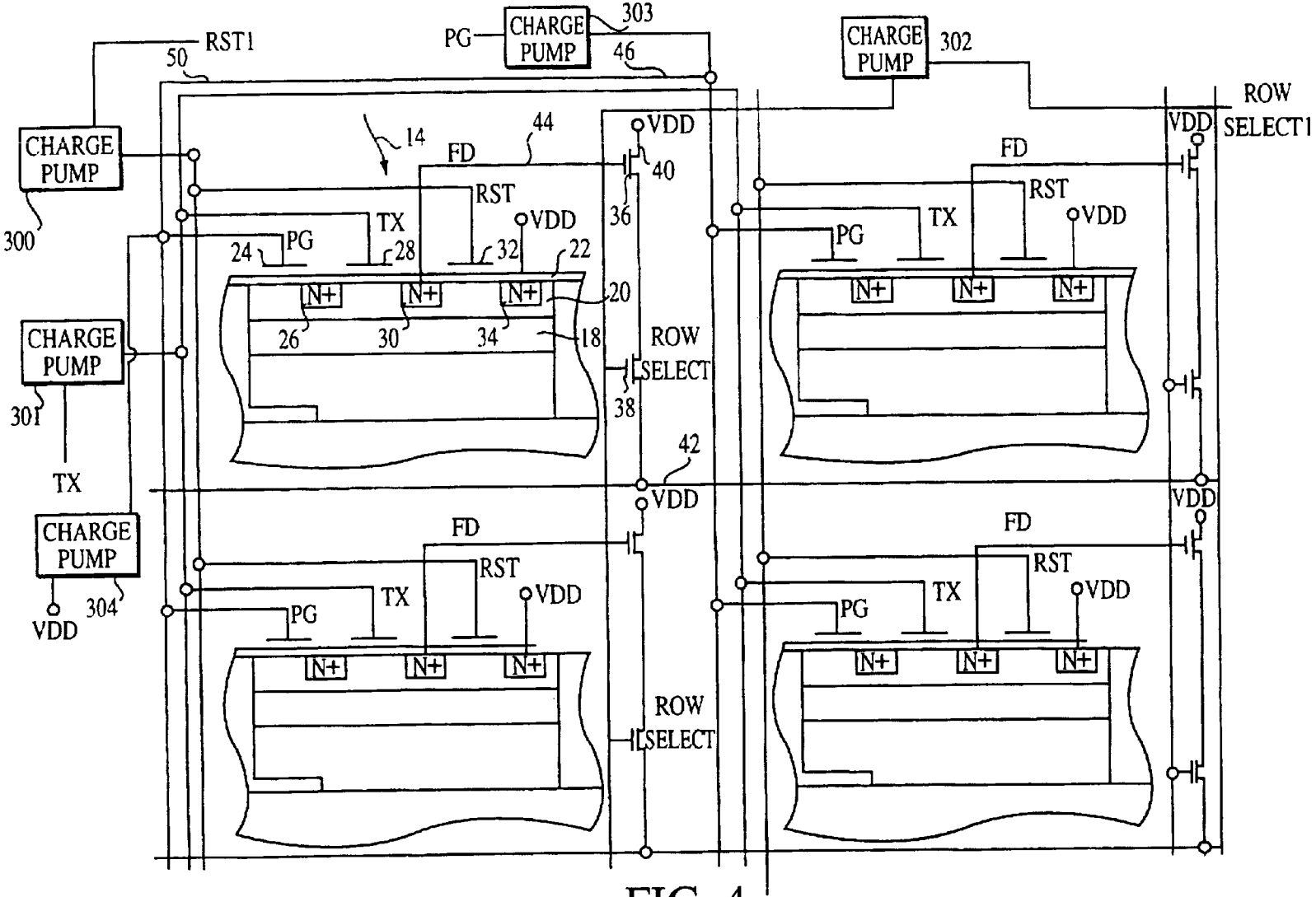
FIG. 4 is a representative pixel layout showing a 2×2 pixel layout according to one embodiment of the present invention.

The present invention will now be described with reference to the figures. Reference is now made to FIG. 4. This figure shows a portion of an active pixel array constructed according to the present invention in which respective charge pumps 300, 301 and 302 are used to supply the gate voltages for the reset, transfer and row select transistors 31, 29 and 38. In addition, a charge pumps 303 and 304 are shown for providing a gate voltage to a photogate 24 for charge transfer and charge storage respectively. This figure shows a 2×2 array of pixels for simplification. It should be understood that the invention is directed to a M×N multiple pixel array of any size.

The operation of the FIG. 4 pixel array will now be described. Photodetectors 14 of a row of pixels are coupled via their respective row select transistors 38 to column line 42. The photodetector selected by a row decoder over line 86 will provide electrical current depending upon the voltage at the gate of source follower transistor 36 supplied by floating diffusion node 30. As noted, the gate of transistor 36 controls the current through load transistor 39 (not shown in FIG. 4) and in consequence the voltage on lead 42.

Signal ROW SELECT1 on lead 86 turns row select transistor 38 on. The voltage controlled by the row select signal 86 is a charge pump 302 output voltage. Row select 86 is connected to charge pump 302 to overdrive the row select transistor, that is, the gate voltage of transistor 38 is higher than the VDD supply voltage. In a 5V VDD system, charge pump 302 will supply at least VDD+Vth volts to the gate of row select transistor 38 where Vth is the threshold voltage for transistor 38. The reset signal RST1 turns on transistor 31 which causes the floating diffusion node 30 to be reset to a potential of VDD−Vth, where Vth is the threshold voltage of the reset transistor 31. In the invention, the actual gate signal to transistor 31 is supplied by charge pump 300 to overdrive the gate of the reset transistor with a voltage of at least the value VDD+Vth to maintain a constant voltage reset value on node 30 at VDD. By having a higher reset voltage available at node 30, a wider dynamic response range is available for the pixel output signal and variation in the voltage at which the floating diffusion node 30 is reset due to the reset transistor 31 Vth variation is reduced.

The photogate 24 is also supplied from a charge pump 304, ensuring that the photogate to be overdriven to its on state to ensure that all possible collected charge for an image signal is stored in the imager substrate beneath the photogate until it is to be transferred out of the collection area. The photogate 24 is also supplied from a charge pump 303 in response to photogate signal PG over line 46, ensuring that the photogate to be overdriven to its on state to ensure that all possible collected charge for an image signal is transferred from the substrate beneath the photogate to the collection area.

The FIG. 4 circuit shows use of a transfer gate 28 and associated transistor 29. If the CMOS imager cells uses a transfer transistor, then the transfer gate 28 voltage is also supplied from a charge pump 301 in response to transfer signal TX, once again ensuring that the transfer transistor is overdriven to its on state and eliminating the Vth voltage drop which normally occurs. The operation of the FIG. 4 circuit to acquire, transfer and output pixel charge is otherwise as previously described.

In the invention, the charge pumps 300, 301 provide voltage to the reset gate 32 and transfer gate 28 at a potential which is greater than the supply potential VDD. The pumped voltage enhances the performance of the transfer and reset transistors. In order to turn "on" the various transistors of the pixel array, a gate voltage to the transistor must exceed a source or drain voltage (depending on the type of transistor) by a threshold voltage Vth. However, the threshold voltage (Vth) may differ for each transistor of a pixel array due to manufacturing imperfections. As a consequence, when all transistors of the array are turned "on" or "off" using the voltage supply potentials to supply control signals to the gates of the transistors, some transistors which are turned "on" are more "on" than other transistors thereby inconsistently transferring and/or amplifying the pixel charges transferred to the pixel output line 42. Likewise, some of the transistors which are turned "off" are more "off" than other transistors causing leakage. This is reflected as an improper output of signals reflecting the charges collected by the photodetector circuit 14.

The charge pumps 300, 301, 302 and 304 help to overcome the inconsistent on/off threshold voltages (Vth) of the transistors by overdriving the gates with voltages which ensure that they turn on or off as required, regardless of manufacturing inconsistencies. Also, the charge pump 300 increases the dynamic operating range of each pixel since the full reset voltage VDD will be applied to the floating diffusion node 30. The charge pump 303 ensures that the maximum possible charges are collected in the collection region beneath the photogate.

While multiple charge pumps 300, 301, 302, 303, 304 are shown in FIG. 4 for the entire CMOS pixel array, it should be understood that a single charge pump having multiple controlled output voltages may be used for the entire CMOS imager and for associated logic circuits. Also, individual charge pumps may be used for different portions of the imager circuit and for the associated logic. Also, while the charge pumps 300, 301, 302, 303, 304 are shown supplying voltage for the reset gate, the transfer gate, the row select gate and the photogate, it should be understood that a charge pump may be used for one or more of these gates to achieve a benefit over conventional CMOS imagers which do not use a charge pump.

Figure 5:
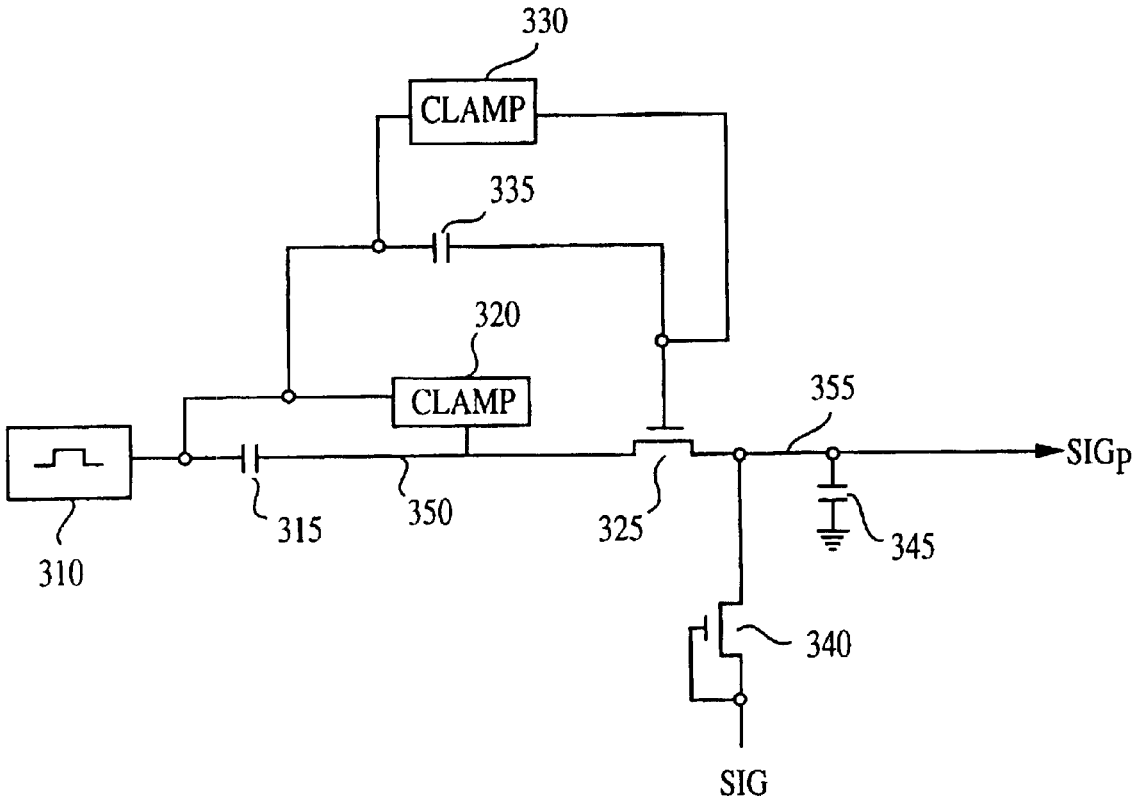
FIG. 5 is a representative circuit drawing of a charge pump that may be used with the present invention.

Reference is now made to FIG. 5 which shows one exemplary charge pump which may be used for one or more of charge pumps 300, 301, 302, 303 and 304. Charge pumps, per se, are well known, such as those shown in U.S. Pat. No. 5,038,325 which is herein incorporated by reference. The exemplary charge pump, shown in FIG. 5, uses two clamp circuits 320, 330. An oscillator 310 provides its output to first and second capacitors 315, 335. Clamp circuits 320, 330 are connected across the capacitors 315, 335. The oscillator 310 is a ring oscillator which can be adjusted to increase or decrease its output signal frequency.

An output transistor 325 is connected between node 350 of capacitors 315 and a circuit output 355 node. An input signal SIG, which might vary between VDD and VSS, is output as an elevated potential signal SIGp which may vary between VSS and VDDp where VDDp>VDD. Where the potential signal SIGp is desired to be less than the operating voltage, i.e., charge pump 303, the output signal SIGp which may vary between VSSp and VDD where VSSp<VSS.

Both clamp circuits 320, 330 turn on and off at the same time, but the connection of clamp circuit 330 across capacitor 335 and in series with the output transistor has the result that the operation of the second clamp circuit 330 causes the output transistor 325 to conduct when potential at the node 350 is at a high potential. The rising edge of the oscillator 310 couples a high voltage through the capacitors 315, 335 which shuts the clamps 320, 330 off and allows the nodes 350, 355 to go high. The falling edge of the output of the oscillator 310 couples a drop in potential through the capacitors 315, 335, at which point, the clamps 320, 330 turns on, preventing the nodes 350, 355 from going low. A decoupling capacitor 345 further cooperates with the charge pump 300 in order to provide a steady boosted output which is switched by input signal SIG.

For operating the photogate PG, the charge pump 303 is configured to supply an output voltage VSSp where VSSp<VSS. For collecting charge in the photogate, the charge pump 304 is configured to supply an output voltage VPGp where VPGp is greater than input voltage VDD.

As noted, the particular construction of the charge pump is not critical to the invention and many circuits besides the FIG. 5 circuit can be used. A representative output voltages of charge pumps 300, 301, 302, 304 are 6.0, 6.0 and 6.0, respectively for a 5.0 volt VDD supply and assuming that the Vth of each of these transistors is less than 1.0 volts. The charge pump 303 output has a representative voltage value of −1 volt. It should be understood that the output of voltage charge pumps 300, 301, 302, 303 and 304 may vary, individually, depending upon the VDD and/or VSS supply as well as the Vth of the individual transistors.

Figure 6:
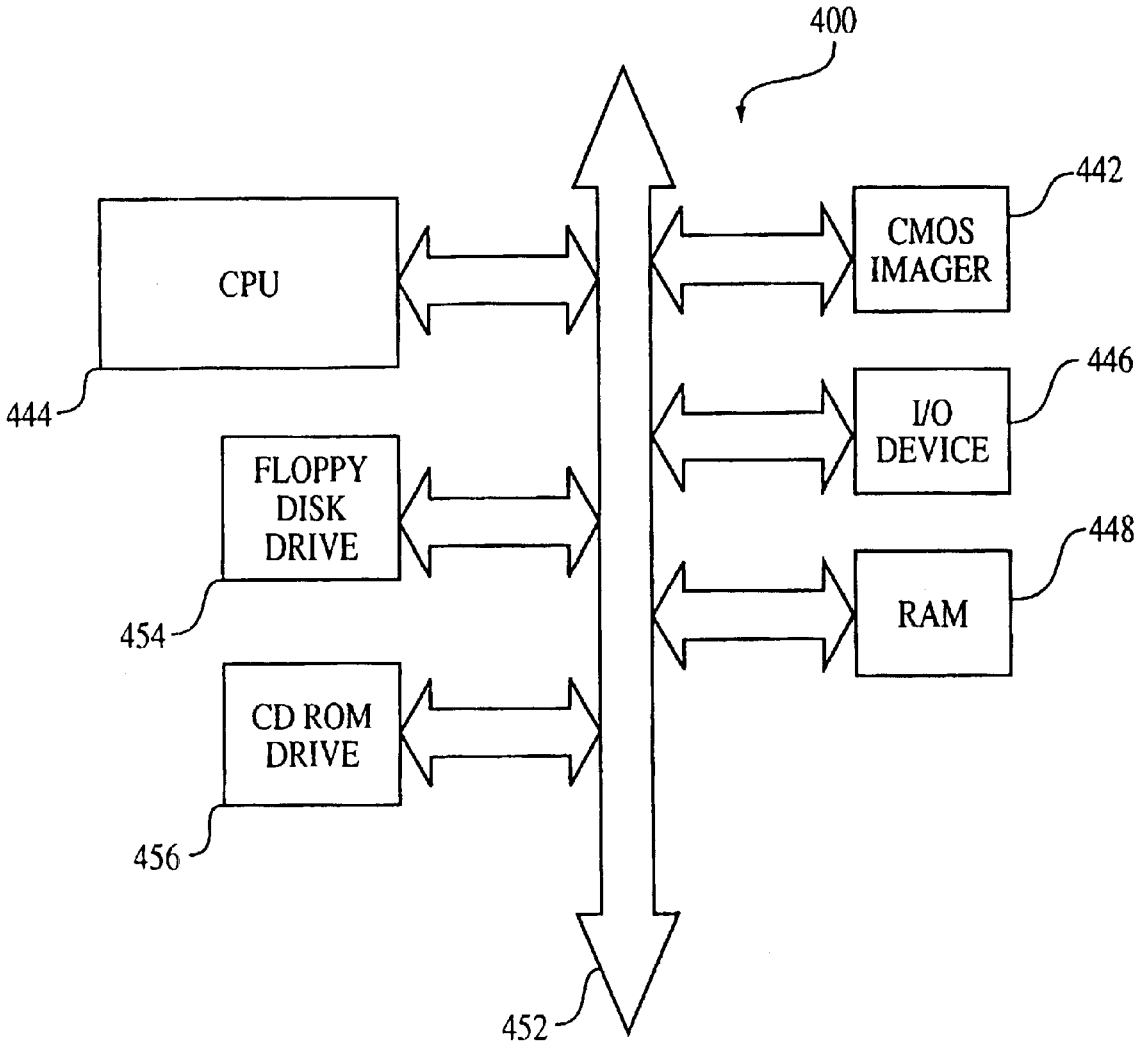
FIG. 6 is an illustration of a computer system having a CMOS imager according to the present invention.

A typical processor based system which includes a CMOS imager device according to the present invention is illustrated generally at 400 in FIG. 6. A processor based system is exemplary of a system having digital circuits which could include CMOS imager devices. Such a system could include a computer system, camera system, scanner, machine vision system, vehicle navigation system, video phone, surveillance system, auto focus system, star tracker system, motion detection system, image stabilization system and data compression system for high-definition television, all of which can utilize the present invention.

A processor system, such as a computer system, for example generally comprises a central processing unit (CPU) 444 that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk driver 454 and a compact disk (CD) ROM drive 456 and I/O devices like a keyboard and/or mouse which also communicate with CPU 444 over the bus 452. CMOS imager 442 is preferably constructed as an integrated circuit which includes the voltage charge pumps 300, 301 and 302, as previously described with respect to FIGS. 4–7.

It should again be noted that although the invention has been described with specific reference to a CMOS imaging circuit having a photogate 24 and a floating diffusion node 30, the invention has broader applicability and may be used in any CMOS imaging apparatus. Similarly, the process described above for charge collection, transfer and readout is but one method of many that could be used. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. An imaging device comprising:

a photosensitive area within a substrate for accumulating photo-generated charge in said area;

a readout circuit comprising at least an output transistor formed in said substrate;

a controllable charge transfer region having a control terminal, said transfer region being formed in said substrate adjacent said photosensitive area and having a node connected to a gate of said output transistor and at least one charge transfer device for transferring charge from said photosensitive area to said node in accordance with a transfer control signal applied to said control terminal; and a charge pump coupled to a supply voltage and connected to supply said control signal to said charge transfer device.

2. The imaging device according to claim 1, wherein the accumulation of charge in said photosensitive area is conducted by a photogate.

3. The imaging device according to claim 1, wherein said photosensitive area is a photodiode.

4. The imaging device according to claim 1, wherein said charge transfer device comprises a field effect transistor and said charge pump is connected to the gate of said field effect transistor.

5. The imaging device according to claim 1, wherein said node is a floating diffusion node.

6. The imaging device according to claim 1, wherein the output of said charge pump is at a voltage greater than VDD, where VDD is a supply voltage.

7. The imaging device according to claim 1, wherein the output of said charge pump is at a voltage of at least VDD+Vth, where VDD is a supply voltage and Vth is a gate threshold voltage of said charge transfer device.

8. An imaging device comprising:

a photosensitive area within a substrate for accumulating photo-generated charge in said area;

a readout circuit comprising at least an output transistor formed in said substrate;

a controllable charge transfer region having a control terminal, said transfer region being formed in said substrate adjacent said photosensitive area and having a node connected to a gate of said output transistor and at least one charge transfer device for transferring charge from said photosensitive area to said node in accordance with a transfer control signal applied to said control terminal; and a reset transistor responsive to a reset control signal for resetting said node to a predetermined charge condition prior to the transfer of charge thereto from said photosensitive area; and a charge pump coupled to a supply voltage and connected to supply said reset control signal to said reset transistor.

9. The imaging device according to claim 8, wherein the accumulation of charge in said photosensitive area is conducted by a photogate.

10. The imaging device according to claim 8, wherein said photosensitive area is a photodiode.

11. The imaging device according to claim 8, further comprising a node connected to a gate of said output transistor and at least one charge transfer device for transferring charge from said photosensitive area to said node in accordance with a transfer control signal applied to said control terminal.

12. The imaging device according to claim 11, further comprising a charge pump coupled to a supply voltage and connected to supply said control signal to said control transfer device.

13. The imaging device according to claim 11, wherein said charge transfer region is controlled by a field effect transistor.

14. The imaging device according to claim 11, wherein said node is a floating diffusion node.

15. The imaging device according to claim 8, wherein the output of said charge pump is at a voltage greater than VDD, where VDD is a supply voltage.

16. The imaging device according to claim 8, wherein said reset device comprises a field effect transistor and said reset control signal is applied to a gate of said field effect transistor and the output of said charge pump is at a voltage of at least VDD+Vth, where VDD is a supply voltage and Vth is a gate threshold voltage of said field effect transistor.

17. An imaging device comprising:

a photosensitive area within a substrate for accumulating photo-generated charge in said area;

a readout circuit comprising at least an output transistor formed in said substrate;

a charge transfer region being formed in said substrate adjacent said photosensitive area;

a row select transistor for reading out a signal from said output transistor in response to a row select signal; and a charge pump coupled to a supply voltage and connected to supply said row select signal to a gate of said row select transistor.

18. The imaging device according to claim 17, wherein the accumulation of charge in said photosensitive area is conducted by a photogate.

19. The imaging device according to claim 17, wherein said photosensitive area is a photodiode.

20. The imaging device according to claim 17, further comprising a node connected to a gate of said output transistor and at least one charge transfer device for transferring charge from said photosensitive area to said node in accordance with a transfer control signal applied to said control terminal.

21. The imaging device according to claim 20, further comprising a charge pump coupled to a supply voltage and connected to supply said control signal to said control transfer device.

22. The imaging device according to claim 20, wherein said charge transfer region is controlled by a field effect transistor.

23. The imaging device according to claim 20, wherein said node is a floating diffusion node.

24. The imaging device according to claim 17, wherein the output of said charge pump is at a voltage greater than VDD, where VDD is a supply voltage.

25. The imaging device according to claim 17, wherein the output of said charge pump is at a voltage of at least VDD+Vth, where VDD is a supply voltage and Vth is a gate threshold voltage of said row select transistor.

26. An imaging device comprising:

a photosensitive area within a substrate for accumulating photo-generated charge in said area;

a readout circuit comprising at least an output transistor formed in said substrate;

a controllable charge transfer region having a control terminal, said transfer region being formed in said substrate adjacent said photosensitive area and having a node connected to a gate of said output transistor and at least one charge transfer device for transferring charge from said photosensitive area to said node in accordance with a transfer control signal applied to said control terminal;

a reset transistor responsive to a reset control signal for resetting said node to a predetermined charge condition prior to the transfer of charge thereto from said photosensitive area;

a row select transistor for reading out a signal from said output transistor in response to a row select signal;

a first charge pump coupled to a supply voltage and connected to supply said control signal to said charge transfer device;

a second charge pump coupled to a supply voltage and connected to supply said reset select signal to said reset transistor; and a third charge pump coupled to a supply voltage and connected to supply said row select signal to said row select transistor.

27. The imaging device according to claim 26, wherein the accumulation of charge in said photosensitive area is conducted by a photogate.

28. The imaging device according to claim 27, further comprising a fourth charge pump coupled to a supply voltage and connected to supply a control signal to said photogate.

29. The imaging device according to claim 26, wherein said photosensitive area is a photodiode.

30. The imaging device according to claim 26, wherein said charge transfer region is controlled by a field effect transistor.

31. The imaging device according to claim 26, wherein said node is a floating diffusion node.

32. The imaging device according to claim 26, wherein the output of said charge pump is at a voltage greater than VDD, where VDD is a supply voltage.

33. The imaging device according to claim 26, wherein the output of said charge pumps are at a voltage of at least VDD+Vth, where VDD is a supply voltage and Vth is a gate threshold voltage of said respective transistors.

34. An imaging device comprising:

a photosensitive device formed in a substrate for accumulating photo-generated charge in said substrate;

a readout circuit comprising at least an output transistor formed in said substrate;

a controllable charge transfer region having a control terminal, said transfer region being formed in said substrate adjacent said photosensitive area and having a node connected to a gate of said output transistor and at least one charge transfer device for transferring charge from said photosensitive area to said node in accordance with a transfer control signal applied to said control terminal;

a reset transistor responsive to a reset control signal for resetting said node to a predetermined charge condition prior to the transfer of charge thereto from said photosensitive area;

a row select transistor for reading out a signal from said output transistor in response to a row select signal; and a charge pump connected to a supply voltage and supplying a voltage to at least said charge transfer device in response to a charge transfer control signal.

35. The imaging device according to claim 34, wherein said photosensitive device is a photogate.

36. The imaging device according to claim 34, wherein said photosensitive device is a photodiode.

37. The imaging device according to claim 34, wherein said charge transfer device comprises a field effect transistor and said charge pump is connected to the gate of said field effect transistor.

38. The imaging device according to claim 34, further comprising a charge pump coupled to a supply voltage and connected to control said row select transistor in response to a row select control signal.

39. The imaging device according to claim 34, further comprising a charge pump coupled to a supply voltage and connected to control said reset transistor in response to a reset control signal.

40. The imaging device according to claim 34, further comprising a charge pump coupled to a supply voltage and connected to control said reset transistor in response to a reset control signal; and a charge pump coupled to a supply voltage and connected to control said row select transistor in response to a row select signal.

41. An imaging device comprising:

a photosensitive area within a substrate for accumulating photo-generated charge in said area;

a photogate formed over said photosensitive area;

a readout circuit in said substrate for supplying an output signal representing charge accumulated in said photosensitive area; and a first charge pump coupled to a supply voltage and connected to supply a first photogate control signal to said photogate.

42. The imaging device according to claim 41, further comprising:

a charge transfer region formed in said substrate adjacent said photosensitive area for receiving charge transferred from said photosensitive area; and a reset transistor responsive to a reset control signal for resetting said charge transfer region to a predetermined charge condition prior to the transfer of charge thereto from said photosensitive area.

43. The imaging device according to claim 41 wherein said readout circuit comprises an output transistor, said image device further comprising a node connected to a gate of said output transistor and at least one charge transfer device for transferring charge from said photosensitive area to said node in accordance with a transfer control signal applied to said control terminal.

44. The imaging device according to claim 43, wherein said charge transfer region is controlled by a field effect transistor.

45. The imaging device according to claim 43, wherein said node is a floating diffusion node.

46. The imaging device according to claim 41, wherein the output of said first charge pump is a voltage of VSSp which is lower than a supply voltage VSS.

47. The imaging device according to claim 41, further comprising a second charge pump coupled to a supply voltage and connected to supply a second photogate control signal to said photogate.

48. The imaging device according to claim 47, wherein said first photogate control signal instructs the photogate to accumulate charge and said second photogate control signal instructs the photogate to transfer charge.

49. The imaging device according to claim 47, wherein the output of said second charge pump is at a voltage greater than VDD, where VDD is a supply voltage.

50. The imaging device according to claim 47, wherein the output of said second charge pump is at a voltage of at least VDD+Vth, where VDD is a supply voltage and Vth is a gate threshold voltage of said photogate.

51. The imaging device according to claim 50, wherein the output of said first charge pump is a voltage of VSSp which is lower than a supply voltage VSS.

52. A method for generating an output signal corresponding to an image received by a sensor on an array having rows and columns of pixel cells formed in a substrate, each cell being capable of collecting electrical charge based on a detected light intensity and having a diffusion node in said substrate capable of holding an electrical charge, the method comprising the steps of:

resetting the voltage of the respective diffusion nodes of the cells to a predetermined voltage;

detecting a first reset voltage at respective diffusion nodes of the cells;

transferring electrical charges collected at respective photoregions of the cells to respective diffusion nodes using respective transistors which are controlled by a signal supplied from a charge pump;

detecting a second voltage at respective diffusion nodes of said cells; and generating respective cell output signals from said detected first and second voltage of said cells.

53. The method for generating an output signal according to claim 52, wherein said photoregion is a photogate.

54. The method for generating an output signal according to claim 52, wherein said photoregion is a photodiode.

55. The method for generating an output signal according to claim 52, wherein said reset transistor for resetting the voltage of said diffusion node is connected to a charge pump.

56. The method for generating an output signal according to claim 52, wherein said diffusion node is a floating diffusion node.

57. A method for generating an output signal corresponding to an image received by a sensor array having rows and columns of pixel cells formed in a substrate, each cell being capable of collecting electrical charge based on a detected light intensity and having a diffusion node in said substrate capable of holding an amount of electrical charge, the method comprising the steps of:

resetting the voltage of the respective diffusion nodes of the cells to a predetermined voltage, wherein said voltage is reset by a respective reset transistor which is controlled by a reset signal supplied by a charge pump;

detecting a first reset voltage at respective diffusion nodes of the cells;

transferring electrical charges collected at respective photoregions of the cells to respective diffusion nodes;

detecting a second voltage at respective diffusions node of said cells; and generating cell output signals from said detected first and second voltages of said cells.

58. The method for generating an output signal according to claim 57, wherein said photoregion is a photogate.

59. The method for generating an output signal according to claim 57, wherein said photoregion is a photodiode.

60. The method for generating an output signal according to claim 57, wherein said diffusion nodes are reset by a reset transistor operated by a charge pump.

61. The method for generating an output signal according to claim 57, wherein said diffusion node is a floating diffusion node.

62. The method for generating an output signal according to claim 58, wherein said photogate is activated by a signal coupled to a charge pump.

63. The method for generating an output signal according to claim 57, wherein said electrical charge is transferred by respective cell charge transfer devices coupled to a charge transfer signal provided by a charge pump.

64. The method for generating an output signal corresponding to an image received by a sensor array having rows and columns of pixel cells formed in a substrate, each cell being capable of collecting electrical charge based on a detected light intensity and having a diffusion node in said substrate capable of holding an amount of electrical charge, the method comprising the steps of:

resetting the voltage of the respective diffusion nodes of the cells to a predetermined voltage, wherein said voltage is reset by respective reset transistors which is operated by a reset signal supplied by a first voltage pump;

detecting a first voltage at respective diffusion nodes of the cells;

transferring electrical charges collected at respective photoregions of the cells to said diffusion nodes using respective transistors which are controlled by a transfer signal supplied by a second charge pump;

detecting a second voltage at the respective diffusion nodes of said cells; and generating cell output signals from said detected first and second voltages of said cells.

65. The method for generating an output signal according to claim 64, wherein said photoregion is a photogate.

66. The method for generating an output signal according to claim 64, wherein said photoregion is a photodiode.

67. The method for generating an output signal according to claim 64, wherein said transistors for resetting the voltage of respective diffusion nodes and said transistors for transferring charge to said diffusion nodes are connected to a first and a second charge pump respectively, each of which provides a respective supply voltage of at least VDD+Vth, wherein VDD is a supply voltage and Vth is a gate threshold voltage of the respective reset and transfer transistors.

68. The method for generating an output signal according to claim 64, wherein said diffusion node is a floating diffusion node.

69. An imaging system for generating output signals based on a received image, the imaging system comprising:

a plurality of active pixel cells arranged into an array of rows and columns, each active pixel cell being operable to generate a voltage at a diffusion node corresponding to detected light intensity by the cells, each of said cells including a reset device for resetting a voltage at said diffusion node, a transfer device for transferring charge from a photosensitive area to said diffusion node and a row select device for reading out a signal representing charges at said diffusion node;

at least one voltage pump coupled to a supply voltage and connected to at least one of a reset device, a transfer device and a row select device of said cells to effectively operate said devices in response to respective control signals;

a row decoder having a plurality of row lines connected to the array, each row line being connected to the row select devices for cells in a particular row of said array; and a column decoder having a plurality of column control lines connected to the array for selecting and outputting pixel output signals whereby pixels of the array are selected for output by row address and column address.

70. The imaging system according to claim 69, wherein said active pixel cells each include a photogate at said photosensitive area.

71. The imaging system according to claim 68, wherein the photogates of said cells is connected to a voltage pump which provides a photogate signal to said photogates.

72. The imaging system according to claim 69, wherein said active pixel cells each include a photodiode at said photosensitive area.

73. The imaging system of claim 69, wherein said reset devices are connected to a voltage pump which provides a reset signal to said reset devices.

74. The imaging system of claim 69, wherein said transfer devices are connected to a voltage pump which provides transfer signal to said transfer devices.

75. The imaging system of claim 69, wherein said row select devices are connected to a voltage pump which provides row select signal to said row select devices.

76. The imaging device according to claim 69, wherein the output of said charge pump is at a voltage greater than VDD, where VDD is a supply voltage.

77. The imaging system according to claim 69, wherein said reset device, said transfer device and said row select device are connected to at least one charge pump which provides a charge pump voltage of at least VDD+Vth, wherein VDD is a supply voltage and Vth is a gate threshold voltage.

78. The imaging system according to claim 69, wherein said diffusion node is a floating diffusion node.

79. An imaging system comprising:

(i) a processor; and (ii) a CMOS imaging device for supplying image signals to said processor, said CMOS imaging device comprising:

a photosensitive area within a substrate for accumulating photo-generated charge in said area;

a readout circuit comprising at least an output transistor formed in said substrate;

a controllable charge transfer region having a control terminal, said transfer region being formed in said substrate adjacent said photosensitive area and having a node connected to a gate of said output transistor and at least one charge transfer device for transferring charge from said photosensitive area to said node in accordance with a transfer control signal applied to said control terminal; and a charge pump coupled to a supply voltage and connected to supply said control signal to said charge transfer device.

80. The system according to claim 79, wherein the accumulation of charge in said photosensitive area is conducted by a photogate.

81. The system according to claim 79, wherein said photosensitive area is a photodiode.

82. The system according to claim 79, wherein said node is a floating diffusion node.

83. The system according to claim 79, wherein said system is a camera system.

84. The system according to claim 79, wherein said system is a scanner.

85. The system according to claim 79, wherein said system is a machine vision system.

86. The system according to claim 79, wherein said system is a vehicle navigation system.

87. The system according to claim 79, wherein said system is a video telephone system.

88. An imaging system comprising:

(i) a processor; and (ii) a CMOS imaging device for supplying image signals to said processor, said CMOS imaging device comprising:

a photosensitive area within a substrate for accumulating photo-generated charge in said area;

a readout circuit comprising at least an output transistor formed in said substrate;

a controllable charge transfer region having a control terminal, said transfer region being formed in said substrate adjacent said photosensitive area and having a node connected to a gate of said output transistor and at least one charge transfer device for transferring charge from said photosensitive area to said node in accordance with a transfer control signal applied to said control terminal;

a reset transistor responsive to a reset control signal for resetting said node to a predetermined charge condition prior to the transfer of charge thereto from said photosensitive area; and a charge pump coupled to a supply voltage and connected to supply said reset control signal to said reset device.

89. The system according to claim 88, wherein the accumulation of charge in said photosensitive area is conducted by a photogate.

90. The system according to claim 88, wherein said photosensitive area is a photodiode.

91. The system according to claim 88, wherein said node is a floating diffusion node.

92. The system according to claim 88, wherein said system is a camera system.

93. The system according to claim 88, wherein said system is a scanner.

94. The system according to claim 88, wherein said system is a machine vision system.

95. The system according to claim 88, wherein said system is a vehicle navigation system.

96. The system according to claim 88, wherein said system is a video telephone system.

97. An imaging system comprising:

(i) a processor; and (ii) a CMOS imaging device for supplying image signals to said processor, said CMOS imaging device comprising:

a photosensitive area within a substrate for accumulating photo-generated charge in said area;

a readout circuit comprising at least an output transistor formed in said substrate;

a controllable charge transfer region having a control terminal, said transfer region being formed in said substrate adjacent said photosensitive area and having a node connected to a gate of said output transistor and at least one charge transfer device for transferring charge from said photosensitive area to said node in accordance with a transfer control signal applied to said control terminal;

a row select transistor for reading out a signal from said output transistor in response to a row select signal; and a charge pump coupled to a supply voltage and connected to supply said row select signal to said row select transistor.

98. The system according to claim 97, further comprising a second charge pump coupled to a supply voltage and connected to supply said transfer control signal to said change transfer device.

99. The system according to claim 97, further comprising a reset transistor to reset said node, wherein the gate of said reset transistor is coupled to the output of a third charge pump to supply a reset signal to the gate of said reset transistor.

100. The system according to claim 97, wherein the accumulation of charge in said photosensitive area is conducted by a photogate connected to a fourth charge pump which provides a photogate signal to said photogate.

101. The system according to claim 100, further comprising a fifth charge pump coupled to a supply voltage and connected to said photogate to supply an elevated output voltage to increase charge collection in said photogate.

102. The system according to claim 101, wherein the output of said fifth charge pump is at a voltage greater than VDD, where VDD is a supply voltage.

103. The system according to claim 101, wherein the output of said fifth charge pump is at a voltage of at least VDD+Vth, where VDD is a supply voltage and Vth is a gate threshold voltage of said photogate.

104. The system according to claim 97, wherein the accumulation of charge in said photosensitive area is conducted by a photogate.

105. The system according to claim 97, wherein said photosensitive area is a photodiode.

106. The system according to claim 97, wherein said charge transfer device is controlled by a field effect transistor and said charge pump is connected to the gate of said transistor.

107. The system according to claim 97, wherein said node is a floating diffusion node.

108. The system according to claim 97, wherein said system is a camera system.

109. The system according to claim 97, wherein said system is a scanner.

110. The system according to claim 97, wherein said system is a machine vision system.

111. The system according to claim 97, wherein said system is a vehicle navigation system.

112. The system according to claim 97, wherein said system is a video telephone system.

*113. A pixel for an imaging device comprising:*

*a photosensitive device provided within a substrate for providing photo-generated charges;*

*a circuit associated with said photosensitive device for providing at least one pixel output signal representative of said photo-generated charges, said circuit including at least a first operative device that is responsive to a control signal during operation of said associated circuit; and*

*a first charge pump responsive to an applied control signal for supplying a first pumped voltage signal to said first operative device.*

*114. The pixel of claim 113, wherein said first operative device is a reset device and said first pumped voltage signal is used to reset a portion of said pixel to a predetermined state.*

*115. The pixel of claim 114, wherein said portion receives charges provided by said photosensitive device.*

*116. The pixel of claim 113, wherein said first operative device is a row select device and said first pumped voltage signal is used to output a signal representing charges provided by said photosensitive device.*

*117. The pixel of claim 113, wherein said first operative device is a transistor.*

*118. The pixel of claim 113, wherein said associated circuit further comprises:*

*a second operative device that is responsive to a control signal during operation of said associated circuit; and*

*a second charge pump responsive to an applied control signal for supplying a second pumped voltage signal to said second operative device.*

*119. The pixel of claim 118, wherein said first operative device is a reset device, said first pumped voltage signal is used to reset a portion of said pixel to a predetermined state, said second operative device is a row select device and said second pumped voltage signal is used to output a signal representing charges provided by said photosensitive device.*

*120. The pixel of claim 119, wherein said portion receives charges provided by said photosensitive device.*

*121. The pixel of claim 118, wherein said first and second operative devices are transistors.*

*122. A pixel for an imaging device comprising:*

*a charge storage area within a substrate for storing photo-generated charge;*

*a first transistor electrically coupled to said charge storage area, said first transistor being responsive to a first control signal; and*

*a first charge pump for supplying said first control signal to said first transistor,*

*wherein said first transistor is a reset transistor and said first control signal is used to reset said charge storage area.*

*123. A pixel for an imaging device comprising:*

*a charge storage area within a substrate for storing photo-generated charge;*

*a first transistor electrically coupled to said charge storage area, said first transistor being responsive to a first control signal; and*

*a first charge pump for supplying said first control signal to said first transistor,*

*wherein said first transistor is a row select transistor for outputting a signal representing charge stored in said charge storage area, and said first control signal is used to control the output of said signal.*

*124. A pixel for an imaging device comprising:*

*a charge storage area within a substrate for storing photo-generated charge;*

*a first transistor electrically coupled to said charge storage area, said first transistor being responsive to a first control signal;*

*a first charge pump for supplying said first control signal to said first transistor;*

*a second transistor electrically coupled to receive a signal representing stored charge in said area, said second transistor being responsive to a second control signal; and*

*a second charge pump for supplying said second control signal to said second transistor.*

*125. The pixel of claim 124, wherein said first transistor is a reset transistor, said first control signal is used to reset said storage area, said second transistor is a row select transistor and said second control signal is used to output a signal representing stored charge in said charge storage area.*

*126. A pixel for an imaging device comprising:*

*a charge storage area within a substrate for storing photo-generated charge;*

*a first transistor electrically coupled to said charge storage area, said first transistor being responsive to a first control signal; and*

*a first charge pump for supplying said first control signal to said first transistor,*

*wherein said charge storage area receives charge transferred from a photo conversion device.*

*127. An imaging device comprising:*

*a photosensitive area within a substrate for accumulating photo-generated charge in said area;*

*a readout transistor electrically coupled to said photosensitive area, said readout transistor supplying an output signal representing charge accumulated in said photosensitive area;*

*a row select transistor for reading out the output signal from said readout transistor in response to a row select signal; and*

*a first voltage pump for supplying said row select signal to said row select transistor.*

*128. The imaging device of claim 127, further comprising:*

*a photogate formed over said photosensitive area, said photogate being responsive to a first photogate control signal to accumulate charge in said photosensitive area; and*

*a second voltage pump for supplying said first photogate control signal to said photogate.*

*129. The imaging device of claim 128, wherein said photogate is responsive to a second photogate control signal and said imaging device further comprises a third voltage pump for supplying said second photogate control signal to said photogate.*

*130. The imaging device of claim 128 further comprising:*

*a reset transistor responsive to a reset control signal for resetting an area containing charges accumulated by said photosensitive area; and*

*a third voltage pump for supplying said reset control signal to said reset transistor.*

*131. An imaging device comprising:*

*a photosensitive area within a substrate for accumulating photo-generated charge in said area;*

*a readout circuit for supplying an output signal representing charge accumulated in said photosensitive area;*

*a reset transistor responsive to a reset control signal for resetting an area containing charges accumulated in said photosensitive area; and*

*a first voltage pump for supplying said reset control signal to said reset transistor.*

*132. The imaging device of claim 131, further comprising:*

*a row select transistor for reading out the output signal from said readout circuit in response to a row select signal; and*

*a second voltage pump for supplying said row select signal to said row select transistor.*

*133. The imaging device of claim 131, further comprising:*

*a photogate formed over said photosensitive area, said photogate being responsive to a first photogate control signal to accumulate charge in said photosensitive area; and*

*a second voltage pump for supplying said first photogate control signal to said photogate.*

*134. The imaging device of claim 133, wherein said photogate is responsive to a second photogate control signal and said imaging device further comprises a third voltage pump for supplying said second photogate control signal to said photogate.*

*135. An imaging device comprising:*

*a plurality of pixels arranged in an array, each of said pixels comprising:*

*a photosensitive device provided within a substrate for providing photo-generated charges;*

*a circuit associated with said photosensitive device for providing at least one pixel output signal representative of said photo-generated charges, said circuit including at least a first operative device that is responsive to a control signal during operation of said associated circuit; and*

*a first charge pump responsive to an applied control signal for supplying a first pumped voltage signal to said first operative device.*

*136. The device of claim 135, wherein said first operative device is a reset device and said first pumped voltage signal is used to reset a portion of said pixel to a predetermined state.*

*137. The device of claim 136, wherein said portion receives charges provided by said photosensitive device.*

*138. The device of claim 135, wherein said first operative device is a row select device and said first pumped voltage signal is used to output a signal representing charges provided by said photosensitive device.*

*139. The device of claim 135, wherein said first operative device is a transistor.*

*140. The device of claim 135, wherein said associated circuit further comprises:*

*a second operative device that is responsive to a control signal during operation of said associated circuit; and*

*a second charge pump responsive to an applied control signal for supplying a second pumped voltage signal to said second operative device.*

141. The device of claim 140, wherein said first operative device is a reset device, said first pumped voltage signal is used to reset a portion of said pixel to a predetermined state, said second operative device is a row select device and said second pumped voltage signal is used to output a signal representing charges provided by said photosensitive device.

142. The device of claim 141, wherein said portion receives charges provided by said photosensitive device.

143. The device of claim 140, wherein said first and second operative devices are transistors.

144. The device of claim 140, wherein said associated circuit further comprises:

a third operative device that is responsive to a control signal during operation of said associated circuit; and a third charge pump responsive to an applied control signal for supplying a third pumped voltage signal to said third operative device.

145. An imaging system comprising:

a processor; and an imaging device for supplying image signals to said processor, said imaging device comprising a plurality of pixels arranged in an array, each pixel comprises:

a charge storage area within a substrate for storing photo-generated charge, a first transistor electrically coupled to said charge storage area, said first transistor being responsive to a first control signal, and a first charge pump for supplying said first control signal to said first transistor.

146. The system of claim 145, wherein said first transistor is a reset transistor and said first control signal is used to reset said charge storage area.

147. The system of claim 145, wherein said first transistor is a row select transistor for outputting a signal representing charge stored in said charge storage area, and said first control signal is used to control the output of said signal.

148. The system of claim 145, wherein each pixel further comprises:

a second transistor electrically coupled to receive a signal representing stored charge in said area, said second transistor being responsive to a second control signal; and a second charge pump for supplying said second control signal to said second transistor.

149. The system of claim 148, wherein said first transistor is a reset transistor, said first control signal is used to reset said storage area, said second transistor is a row select transistor and said second control signal is used to output a signal representing stored charge in said charge storage area.

150. The system of claim 145, wherein said charge storage area receives charge transferred from a photo conversion device.

151. An imaging system comprising:

a processor; and an imaging device for supplying image signals to said processor, said imaging device comprising:

a photosensitive area within a substrate for accumulating photo-generated charge in said area, a readout transistor electrically coupled to said photosensitive area, said readout transistor supplying an output signal representing charge accumulated in said photosensitive area, a row select transistor for reading out the output signal from said readout transistor in response to a row select signal, and a first voltage pump for supplying said row select signal to said row select transistor.

152. The system of claim 151, wherein said imaging device further comprises:

a photogate formed over said photosensitive area, said photogate being responsive to a first photogate control signal to accumulate charge in said photosensitive area; and a second voltage pump for supplying said first photogate control signal to said photogate.

153. The system of claim 152, wherein said photogate is responsive to a second photogate control signal and said imaging device further comprises a third voltage pump for supplying said second photogate control signal to said photogate.

154. The system of claim 152, wherein said imaging device further comprises:

a reset transistor responsive to a reset control signal for resetting an area containing charges accumulated by said photosensitive area; and a third voltage pump for supplying said reset control signal to said reset transistor.

155. An imaging system comprising:

a processor; and an imaging device for supplying image signals to said processor, said imaging device comprising:

a photosensitive area within a substrate for accumulating photo-generated charge in said area, a readout circuit for supplying an output signal representing charge accumulated in said photosensitive area, a reset transistor responsive to a reset control signal for resetting an area containing charges accumulated in said photosensitive area, and a first voltage pump for supplying said reset control signal to said reset transistor.

156. The system of claim 155, wherein said imaging device further comprises:

a row select transistor for reading out the output signal from said readout circuit in response to a row select signal; and a second voltage pump for supplying said row select signal to said row select transistor.

157. The system of claim 155, wherein said imaging device further comprises:

a photogate formed over said photosensitive area, said photogate being responsive to a first photogate control signal to accumulate charge in said photosensitive area; and a second voltage pump for supplying said first photogate control signal to said photogate.

158. The system of claim 157, wherein said photogate is responsive to a second photogate control signal and said imaging device further comprises a third voltage pump for supplying said second photogate control signal to said photogate.

159. An imaging system comprising:

a processor; and an imaging device for supplying image signals to said processor, said imaging device comprising a plurality of pixels, each of said pixels comprising:

a photosensitive device provided within a substrate for providing photo-generated charges, a circuit associated with said photosensitive device for providing at least one pixel output signal represen-

*tative of said photo-generated charges, said circuit including at least a first operative device that is responsive to a control signal during operation of said associated circuit, and*

*a first charge pump responsive to an applied control signal for supplying a first pumped voltage signal to said first operative device.*

*160. A method of generating an output signal corresponding to an image received by a sensor array having rows and columns of pixel cells formed in a substrate, each cell being capable of collecting electrical charge based on a detected light intensity and having a node in said substrate capable of holding an electrical charge, said method comprises:*

*resetting the voltage of respective nodes of the cells to a predetermined voltage, said voltage being reset by respective reset devices which are operated by a reset control voltage supplied by a first voltage pump;*

*detecting a first voltage at respective nodes of the cells;*

*detecting a second voltage at the respective nodes of the cells; and*

*generating cell output signals from the detected first and second voltages of the cells.*

*161. A method of generating and outputting an output signal corresponding to an image received by a sensor array having rows and columns of pixel cells formed in a substrate, each cell being capable of collecting electrical charge based on a detected light intensity and having a node in said substrate capable of holding an electrical charge, said method comprises:*

*resetting the voltage of respective nodes of the cells to a predetermined voltage;*

*detecting a first voltage at respective nodes of the cells;*

*detecting a second voltage at the respective nodes of the cells;*

*generating cell output signals from the detected first and second voltages of the cells; and*

*outputting the generated output signals using respective row select transistors responsive to respective row select control signals supplied by a first voltage pump.*

* * * * *

UNITED STATES PATENT AND TRADEMARK OFFICE

CERTIFICATE OF CORRECTION

PATENT NO. : RE 39,768 E
APPLICATION NO. : 10/283165
DATED : August 14, 2007
INVENTOR(S) : Rhodes It is certified that error appears in the above-identified patent and that said Letters Patent is hereby corrected as shown below:

On the face page, in field (56), under "Other Publications", in column 2, line 14, delete "Crcuits" and insert -- Circuits --, therefor.

In column 10, line 19 (Approx.), in Claim 8, after "terminal;" delete "and".

In column 19, lines 5-6, in Claim 123, delete "is used" and insert -- issued --, therefor.

Signed and Sealed this

Thirteenth Day of November, 2007

JON W. DUDAS
*Director of the United States Patent and Trademark Office*